United States Patent
Talledo (10) Patent No.: US 11,948,868 B2
(45) Date of Patent: Apr. 2, 2024

(54) COMPACT LEADFRAME PACKAGE

(71) Applicant: STMICROELECTRONICS, INC., Calamba (PH)

(72) Inventor: Jefferson Talledo, Calamba (PH)

(73) Assignee: STMICROELECTRONICS, INC., Calamba (PH)

( * ) Notice: Subject to any disclaimer, the term of this patent is extended or adjusted under 35 U.S.C. 154(b) by 14 days.

(21) Appl. No.: 17/537,318

(22) Filed: Nov. 29, 2021

(65) Prior Publication Data

US 2022/0084913 A1  Mar. 17, 2022

Related U.S. Application Data

(62) Division of application No. 16/707,823, filed on Dec. 9, 2019, now Pat. No. 11,227,817.

(Continued)

(51) Int. Cl.
*H01L 23/495* (2006.01)
*H01L 21/48* (2006.01)
(Continued)

(52) U.S. Cl.
CPC .... *H01L 23/49548* (2013.01); *H01L 21/4828* (2013.01); *H01L 23/3142* (2013.01); *H01L 23/49513* (2013.01); *H01L 24/32* (2013.01); *H01L 24/48* (2013.01); *H01L 24/49* (2013.01); *H01L 24/73* (2013.01);
(Continued)

(58) Field of Classification Search
CPC ........... H01L 23/49548; H01L 21/4828; H01L 23/3142; H01L 23/49513; H01L 24/48; H01L 24/49; H01L 2224/48175; H01L 24/29; H01L 24/83; H01L 2924/181; H01L 23/3107; H01L 23/49503; H01L 21/4821; H01L 23/3121
See application file for complete search history.

(56) References Cited

U.S. PATENT DOCUMENTS 6,448,633 B1  9/2002  Yee et al.
6,525,406 B1  2/2003  Chung et al.
(Continued)

FOREIGN PATENT DOCUMENTS

CN  211125636 U  7/2020
KR  1020080063995 A  7/2008

*Primary Examiner* — Thanhha S Pham
(74) *Attorney, Agent, or Firm* — Seed IP Law Group LLP (57) ABSTRACT

Generally described, one or more embodiments are directed to a leadframe package having a plurality of leads, a die pad, a semiconductor die coupled to the die pad, and encapsulation material. An inner portion of the die pad includes a perimeter portion that includes a plurality of protrusions that are spaced apart from each other. The protrusions aid in locking the die pad in the encapsulation material. The plurality of leads includes upper portions and base portions. The base portion of the plurality of leads are offset (or staggered) relative to the plurality of protrusions of the die pad. In particular, the base portions extend longitudinally toward the die pad and are located between respective protrusions. The upper portions of the leads include lead locks that extend beyond the base portions in a direction of adjacent leads. The lead locks and the protrusion in the die pad aid in locking the leads and the die pad in the encapsulation material.

18 Claims, 7 Drawing Sheets

Related U.S. Application Data

(60) Provisional application No. 62/778,705, filed on Dec. 12, 2018.

(51) Int. Cl.
*H01L 23/00* (2006.01)
*H01L 23/31* (2006.01)

(52) U.S. Cl.
CPC ............ *H01L 2224/32245* (2013.01); *H01L 2224/48175* (2013.01); *H01L 2224/73265* (2013.01)

(56) References Cited

U.S. PATENT DOCUMENTS

| | | |
|---|---|---|
| 6,984,878 B2 | 1/2006 | Park et al. |
| 7,338,841 B2 | 3/2008 | Lau |
| 7,781,899 B2 | 8/2010 | Sim et al. |
| 8,441,110 B1 | 5/2013 | Choi |
| 9,165,863 B2 | 10/2015 | Cruz |
| 9,508,631 B1 | 11/2016 | Bae et al. |
| 2004/0150086 A1* | 8/2004 | Lee .................. H01L 23/3107 257/678 |
| 2007/0052070 A1 | 3/2007 | Islam et al. |
| 2008/0079124 A1 | 4/2008 | Haga et al. |
| 2009/0283893 A1 | 11/2009 | Do et al. |
| 2011/0108969 A1 | 5/2011 | Do et al. |

* cited by examiner

COMPACT LEADFRAME PACKAGE

BACKGROUND

Technical Field

Embodiments of the present disclosure are directed to semiconductor packages and methods of assembling same.

Description of the Related Art

Leadless (or no lead) packages are often utilized in applications in which small sized packages are desired. Typically, the flat leadless packages provide a near chip scale encapsulated package formed from a planar leadframe. Lands located on a bottom surface of the package provide electrical connection to a board, such as a printed circuit board (PCB). Many leadless packages, such as quad flat no lead (QFN) packages, include a semiconductor die or chip mounted to a die pad and electrically coupled to leads, such as by conductive wires. An encapsulation material encloses the semiconductor die and the conductive wires, as well as portions of the die pad and the leads. The encapsulation material protects conductive elements therein.

Manufacturers of these packages face significant challenges to reduce the size of the package, while maintaining minimum specifications, such as distances between electrical components in the package to prevent short circuiting or other electrical failures, as well as suitable sized lands for soldering the package to the PCB. There is a desire for smaller leadless packages that can meet minimum specifications.

BRIEF SUMMARY

Generally described, one or more embodiments are directed to a leadframe package having a plurality of the leads, a die pad, a semiconductor die coupled to the die pad, and encapsulation material. An inner portion of the die pad includes a perimeter portion that includes a plurality of protrusions that are spaced apart from each other. The protrusions aid in locking the die pad in the encapsulation material. The plurality of leads includes upper portions and base portions. The base portions of the plurality of leads are offset (or staggered) relative to the plurality of protrusions of the die pad. In particular, the base portions extend longitudinally toward the die pad and are located between respective protrusions. The upper portions of the leads include lead locks that extend beyond the base portions in a direction of adjacent leads. The lead locks and the protrusions in the die pad aid in locking the leads and the die pad in the encapsulation material.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

DETAILED DESCRIPTION

In the following description, certain specific details are set forth in order to provide a thorough understanding of various aspects of the disclosed subject matter. However, the disclosed subject matter may be practiced without these specific details. In some instances, well-known structures and methods of semiconductor processing, such as forming a semiconductor chip, have not been described in detail to avoid obscuring the descriptions of other aspects of the present disclosure.

Figure 1A:
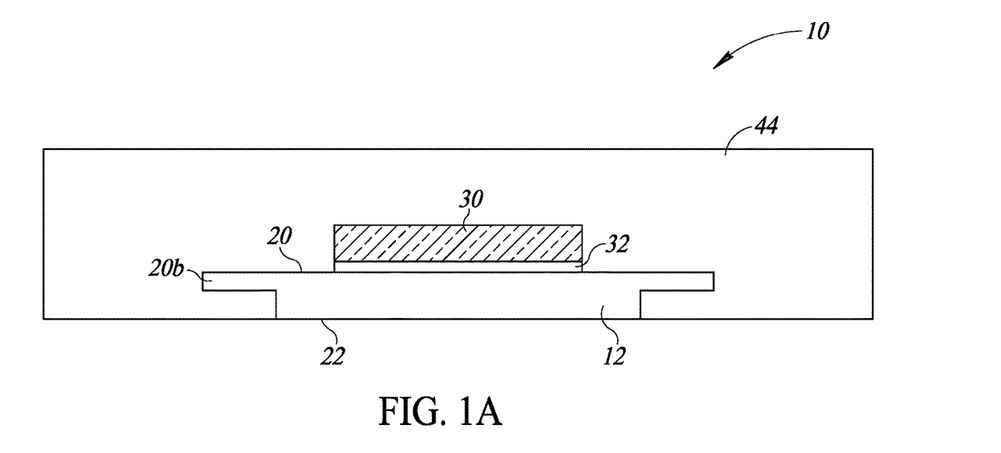
FIG. 1A is a schematic illustration of a cross-sectional view of a semiconductor package in accordance with one embodiment.
Figure 1B:
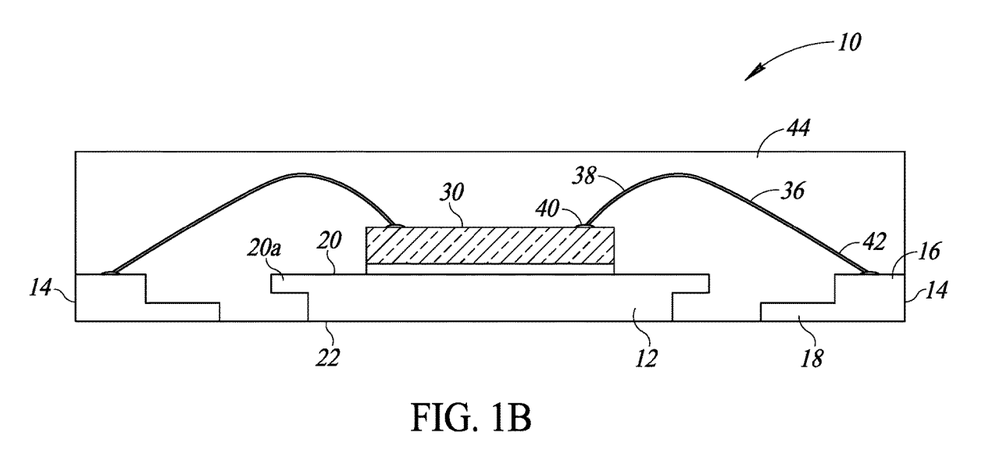
FIG. 1B is a schematic illustration of a cross-sectional view of the semiconductor package of FIG. 1A at another location.

FIGS. 1A and 1B show cross-sectional views of a leadframe semiconductor package 10 in accordance with one embodiment of the disclosure.

Figure 1C:
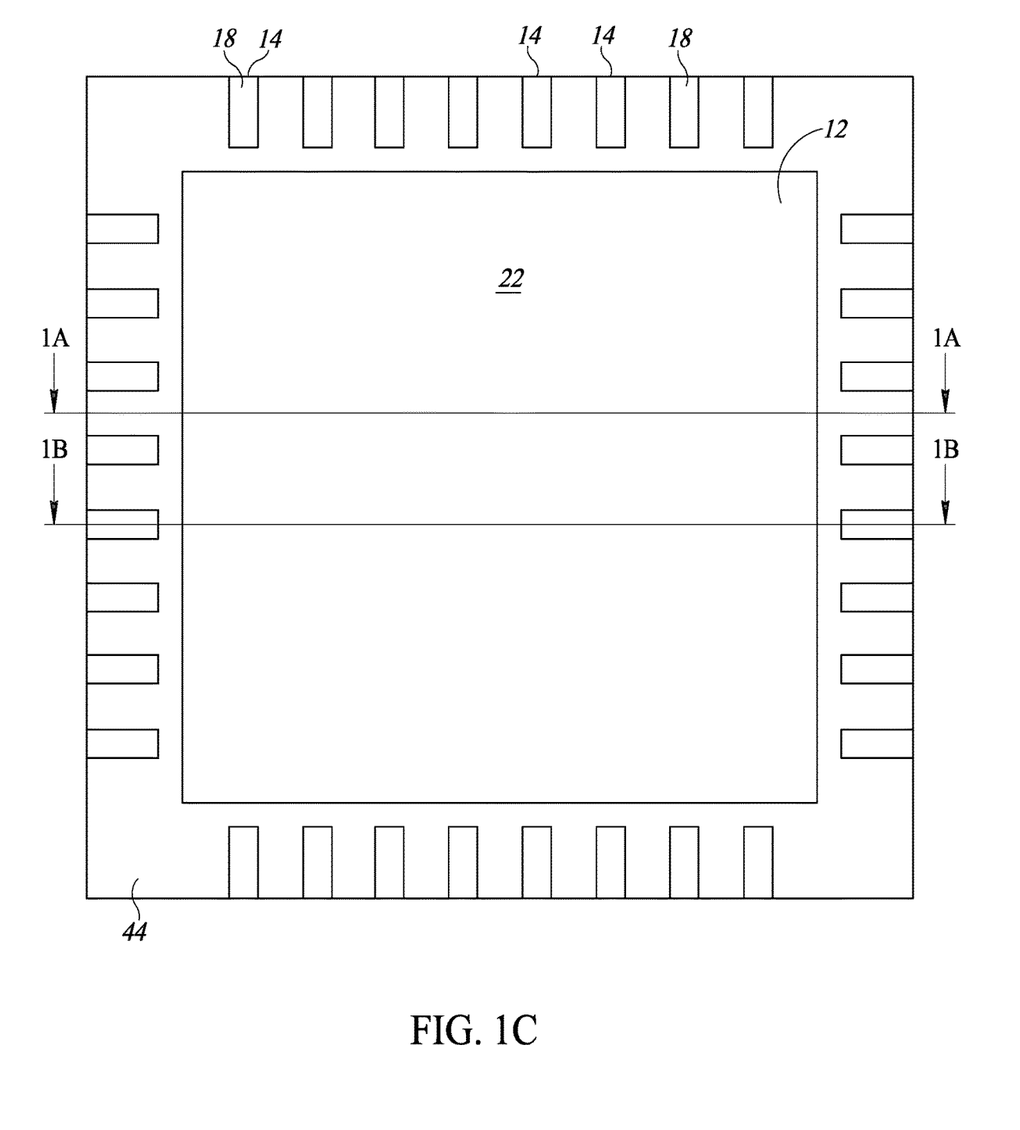
FIG. 1C is a bottom view of the package of FIG. 1A.

FIG. 1C shows a bottom surface of the package and the location of the cross-sectional lines of FIGS. 1A and 1B.

The package 10 is a leadframe package that includes a die pad 12 and a plurality of leads 14 located around all sides of the die pad 12. The leads 14 are spaced from each other and from the die pad 12. With reference to FIG. 1B, the leads 14 include upper portions 16 and base portions 18. As will be explained below, the upper portions 16 include locking features or anchors (lead locks) that aid in securing the leads within the package body, such as encapsulation material 44.

Although eight leads 14 are shown on each side of the package 10 in FIG. 1C, it is to be appreciated that any number of leads may be included in the package, including one lead on one or more sides of the die pad. In at least one embodiment, the leads 14 are provided on two opposing sides of the die pad 12. The die pad 12 and leads 14 are formed from a leadframe of conductive material, such as a metal material. In one embodiment, the leadframe is copper or a copper alloy.

With reference to FIGS. 1A and 1B, the die pad 12 has an inner portion 20 and an outer portion 22. A semiconductor die 30 is secured to a surface of the inner portion 20 of the die pad 12 by an adhesive material 32. The semiconductor die 30 is made from a semiconductor material, such as silicon, and includes an upper active surface that includes electrical components, such as integrated circuits, as is well known in the art. The semiconductor die 30 may incorporate a microelectromechanical sensor (MEMS) device, an Application Specific Integrated Circuit (ASIC), or any other type of active structure. The adhesive material 32 may be any material configured to suitably secure the semiconductor die 30 to the die pad 12, such as glue, paste, tape, and the like.

With reference to FIG. 1B, conductive wires 36 electrically couple the semiconductor die 30 to the upper portions 16 of the leads 14. In particular, a first end 38 of the conductive wire 36 is coupled to a bond pad 40 of the semiconductor die 30 and a second end 42 of the conductive wire 36 is coupled to the upper portion 16 of a respective one of the leads 14. The conductive wires 36 provide electrical communication between circuits of the semiconductor die 30 and the leads 14, as is well known in the art.

Encapsulation material 44 is located on the die pad 12 and the leads 14, and surrounds the semiconductor die 30 and the conductive wires 36. The encapsulation material 44 fills the space between adjacent leads 14 and between the leads 14 and the die pad 12. The encapsulation material 44 forms a bottom surface of the package 10, along with a surface of the outer portion 22 of the die pad 12 and surfaces of base portions 18 of the leads 14. The surfaces of the base portions 18 of the leads 14 form lands of the package 10. An upper surface of the encapsulation material 44 forms an outer, upper surface of the package 10. Lateral surfaces of the encapsulation material 44, along with lateral surfaces of the leads 14, form outer, lateral surfaces of the package 10.

The encapsulation material 44 is an insulating material that protects the electrical components of the semiconductor die and conductive wires from damage, such as corrosion, physical damage, moisture damage, or other causes of damage to electrical devices and materials. In some embodiments, the encapsulation material is a molding material, such as a polymer, silicone, resin, polyimide, or epoxy.

With reference to FIG. 1A, the inner portion 20 of the die pad 12 is wider than the outer portion 22 of the die pad 12. That is, a perimeter of the inner portion 20 of the die pad 12 extends beyond a perimeter of the outer portion 22 of the die pad 12. As will be explained in more detail below, the perimeter of the inner portion 20 of the die pad 12 acts as a locking feature or anchor that aids in holding the die pad 12 within the encapsulation material 44.

Figure 2A:
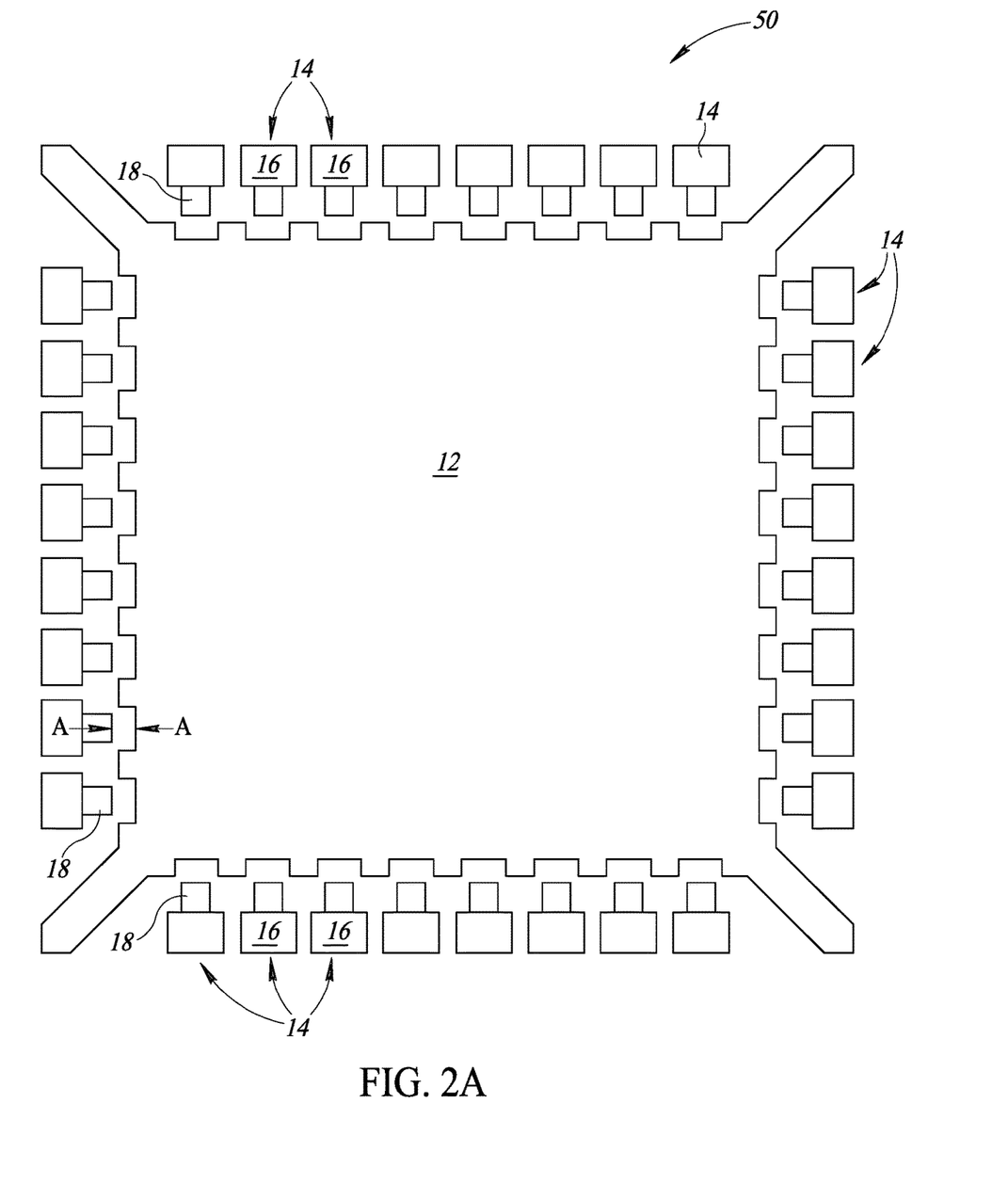
FIGS. 2A-2D are schematic illustrations of various views of the leadframe of the package of FIG. 1.
Figure 2B:
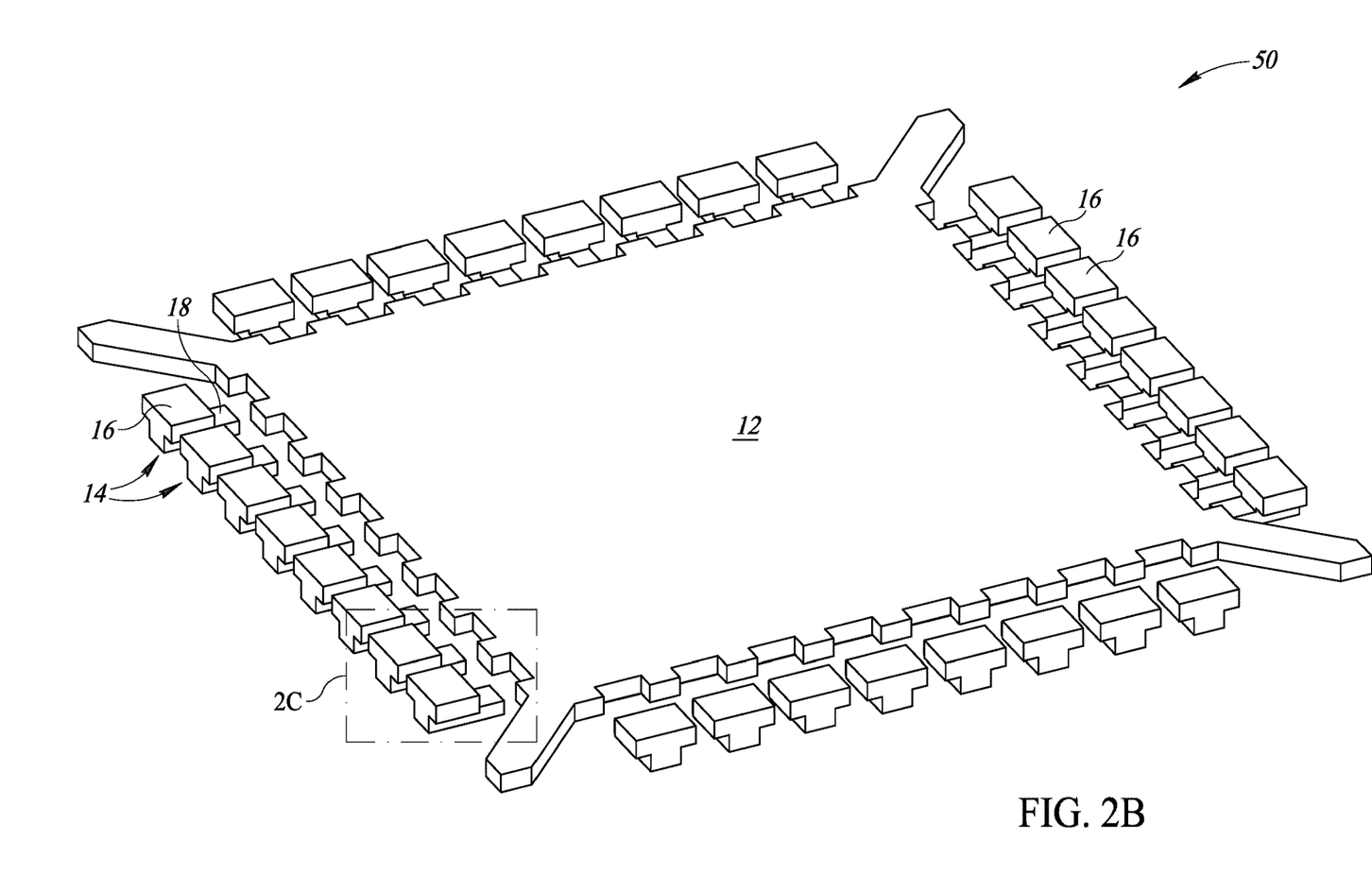
Figure 2C:
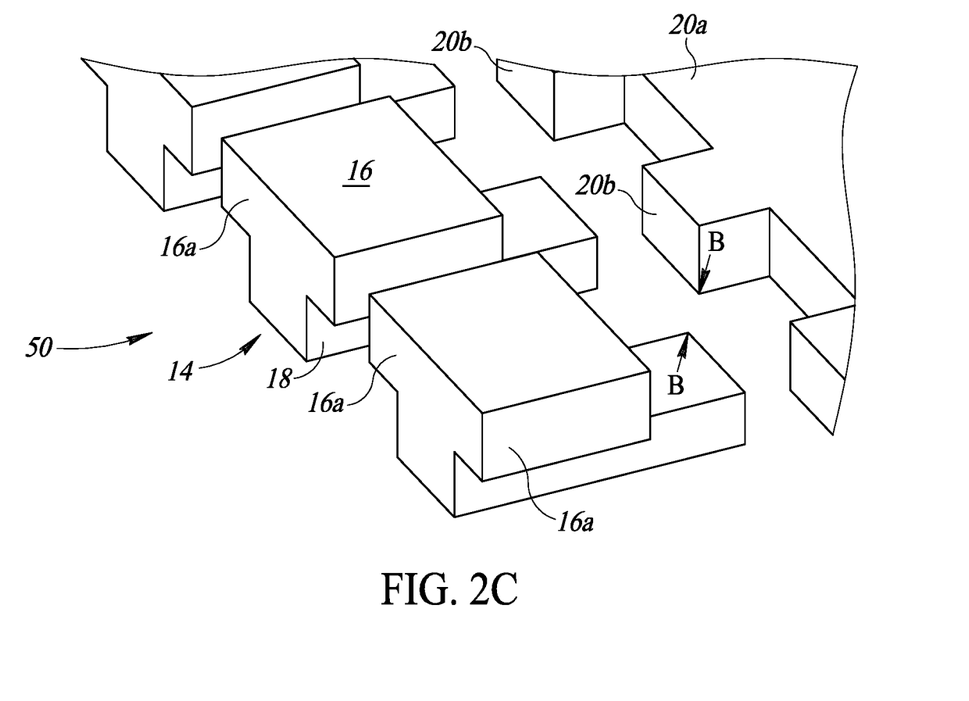
Figure 2D:
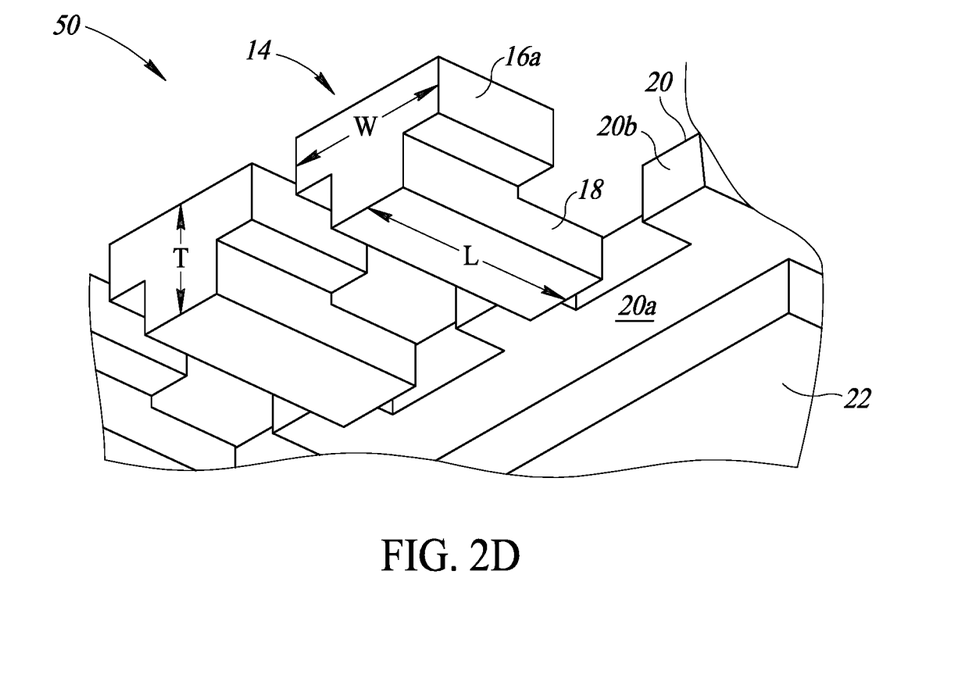

FIG. 2A is a top plan view of a portion of a leadframe 50 comprising the die pad 12 and leads 14 of the package 10 of FIGS. 1A-1C, while FIG. 2B is a top isometric view of the portion of the leadframe 50. FIG. 2C is an exploded top isometric view of a section of the leadframe 50 of FIG. 2B as indicated by the box in FIG. 2B, while FIG. 2D is an exploded bottom isometric view of the boxed section.

In the illustrated embodiment, the leadframe 50 has been formed from a leadframe having a constant thickness. Thus, surfaces of the upper portions 16 of the leads 14 are coplanar with a surface of the inner portion 20 of the die pad 12; and surfaces of the base portions 18 of the leads 14 are coplanar with the outer portion 22 of the die pad 12.

As previously mentioned, the die pad 12 includes an inner portion 20 and an outer portion 22. As best shown in FIG. 2D, the inner portion 20 has a perimeter 20a that extends beyond the outer portion 22. In particular, the perimeter portion 20a extends beyond the outer portion 22 around the entire perimeter of the die pad 12. The perimeter 20a of the inner portion includes a plurality of spaced apart protrusions 20b. The perimeter portion 20a, including the protrusions 20b, acts as locking features or anchors that aids in holding the die pad 12 within the encapsulation material. That is, when encapsulation material is formed around the leadframe 50, the perimeter portion 20a, including the protrusions 20b, aid in anchoring the die pad 12 in the encapsulation material.

The protrusions 20b form recesses therebetween. The protrusions 20b are staggered with respect to the leads 14 such that the base portions 18 of the leads 14 face the recesses formed between adjacent protrusions 20b of the perimeter portion 20a, as best shown in FIG. 2A. Thus, a minimum distance between the leads 14 and the die pad 12 are maintained as indicated by the arrows A-A in FIG. 2A. In one embodiment, the minimum distance between the leads 14 and the die pad 12 is at least 0.15 millimeter (mm).

With reference to FIG. 2D, each lead 14 has a greatest thickness T, extending from a top of the upper portion 16 to a bottom surface of the base portion 18; a greatest width W, extending in the upper portion 16 in a direction of adjacent leads 14; and a length L, extending in the base portion along a longitudinal axis of the lead 14 toward the die pad 12. The widths of the upper portions 16 are wider than the widths the base portions 18. The lengths of the base portions 18 are longer than the lengths of upper portions 16.

The upper portions 16 of the leads 14 protrude laterally towards adjacent leads in the direction of their greatest width W to form lead locks 16a. That is, the lead locks 16a extend beyond lateral faces of the leads 14 at the base portions 18, such that the base portions 18 of the leads 14 are narrower in the W direction than the upper portions 16. Thus, the minimum distance between the adjacent leads 14 is defined by the distance between the adjacent lead locks 16a. In one embodiment, the minimum distance between the adjacent lead locks 16a is at least 0.15 mm. The lead locks 16a act as a locking feature or anchor that aids in securing the leads 14 within the encapsulation material. That is, encapsulation material, when formed around the leadframe 50, encloses around the upper portions 16 of the leads 14 to aid in anchoring the lead 14 in the encapsulation material.

The base portions 18 of the leads 14 have a greater length L in the longitudinal direction that extends from the leads 14 toward the die pad 12. The longer base portions 18 provide an improved surface area for forming the lands at the bottom surface of the package. In that regard, solder joint reliability for board level reliability (BLR) performance is thereby improved. Due to the recesses between adjacent protrusions 20b of the perimeter portion 20a of the die pad 12, the increased lands are provided without having to increase the package size. As best shown in FIG. 2D, the base portions 18 of the leads 14 each include a central portion that spaces the base portion 18 from the upper portion 16 by a distance. That is, the central portion separates the base portion 18 from the upper portion 16. In the illustrated embodiment, the upper portion 16 of each lead 14 has a same thickness T as the perimeter portion 20a, including the protrusions 20b, of the die pad 12. Furthermore, due to the distance between the upper portion 16 and the base portion 18, due to the central portion, the perimeter portion 20a of the die pad 12 is also spaced from the base portion 18 of the lead 14 in the direction of the thickness T. Thus, a minimum distance between a respective lead 14 and the die pad 14 is defined by the distance as indicated by arrows B-B in FIG. 2C. In at least one embodiment, the minimum distance between the lead 14 and the die pad 12 (at the protrusion 20b) is at least 0.15 mm.

By staggering the base portions 18 of the leads 14 with the protrusions 20b of the perimeter portion 20a of the die pad 12, the size of the package may be reduced while maintaining suitable sized lands of the leads for coupling to another device. Furthermore, forming lead locks that extend in the direction of adjacent leads also allows for suitable the sized lands.

Figure 3A:
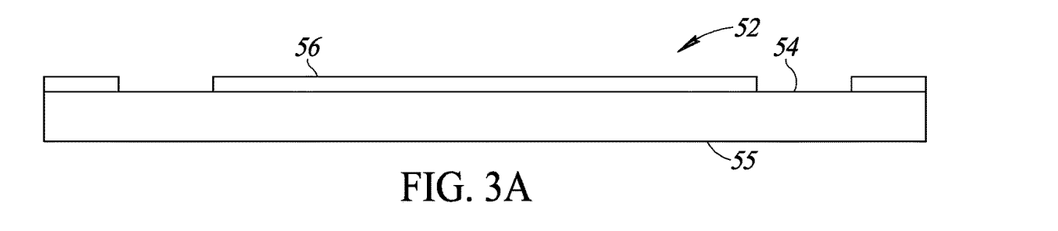
FIGS. 3A-3F are cross-sectional views illustrating stages of manufacturing the leadframe semiconductor package of FIG. 1A in accordance with one embodiment.
Figure 3B:
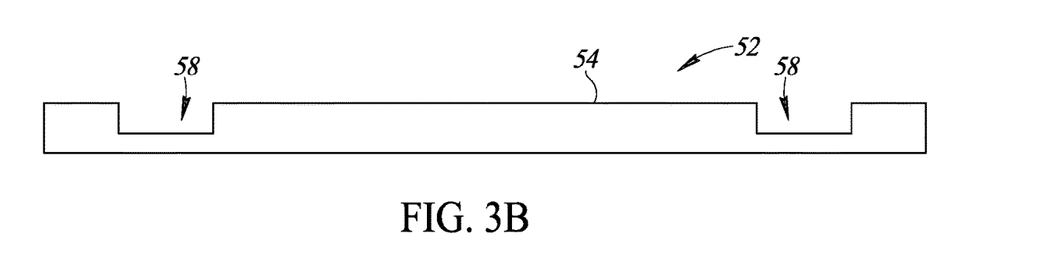

FIGS. 3A-3F illustrate various stages of manufacturing the leadframe semiconductor package 10 of FIGS. 1A-1C. As shown in FIG. 3A, a portion of a leadframe strip 52 is provided. The leadframe strip 52 is a conductive material, such as metal, and in some embodiments is made of copper or a copper alloy. Although only one die pad and set of leads are shown, the leadframe strip 52 includes a plurality of die pads 12, leads 14, and connecting bars or tie bars (not shown) that are coupled together. The leadframe strip 52 may include die pads arranged in a single row, or may include an array of die pads, as is well known in the art.

The leadframe strip 52 includes an upper surface 54 and a lower surface 55. A patterned layer 56 is formed on the upper surface 54 of the leadframe strip 52. The patterned layer 56 may be any suitable material, such as a light sensitive material like photoresist. The patterned layer 56 on the upper surface 54 includes openings at which portions of the leadframe strip 52 will be etched to form first recesses 58 to thereby form the upper portions 16 of the leads 14, the protrusions 20*b* of the die pad 12 and to separate the leads from each other and the die pad at the upper surface. In particular, the upper surface 54 of the leadframe strip 52 is half-etched in a first etch step to form the first recesses 58. The first etch step may include a wet etch, a dry etch, or a combination thereof, in accordance with standard semiconductor processing techniques. The first recesses 58 may have a depth that is more than halfway through the thickness of the leadframe strip 52 from the upper surface 54. For instance, the first recesses 58 may extend between 60% or 70% of the thickness of the leadframe strip. In one embodiment, the recesses 58 extend through 60% of the thickness of the leadframe strip 52. As shown in FIG. 2B, the patterned layer 56 is removed from the upper surface 54 of the leadframe strip 52.

Figure 3C:
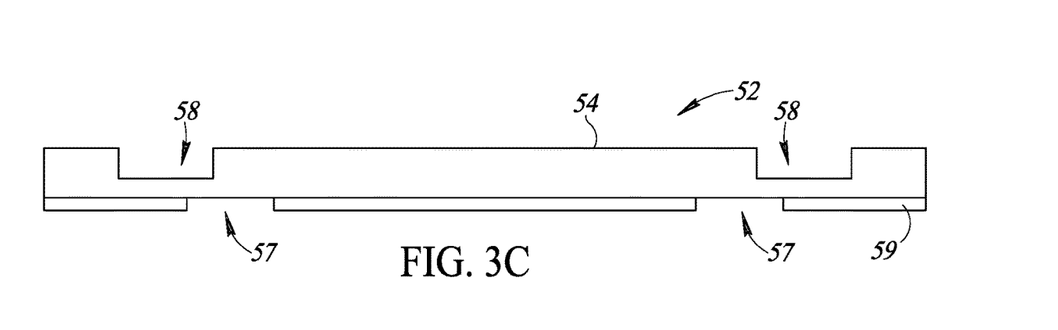
Figure 3D:
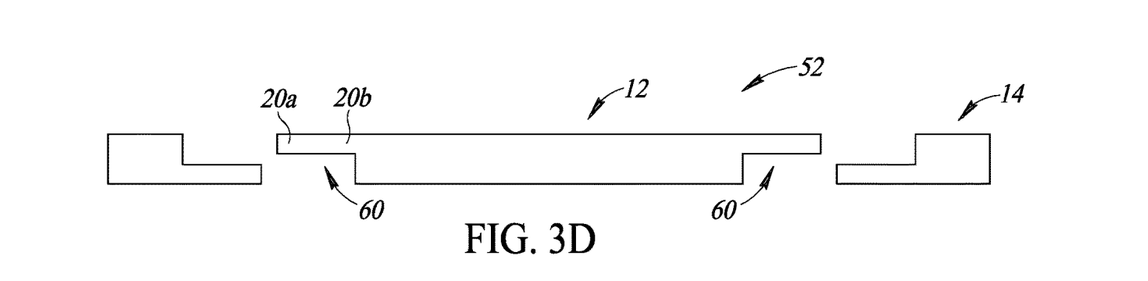

Similarly, another patterned layer 59 with openings 57 is formed on the lower surface 55 of the leadframe strip 52 as shown in FIG. 3C to form second recesses 60 as shown in FIG. 3D. The openings 57 overlap portions of the first recesses 58 such that after an etch step, the die pad 12 and the leads 14 are formed. In particular, the patterned layer 59 on the lower surface 55 includes openings 57 at which portions of the leadframe strip 52 will be etched to form the second recesses 60. In particular, the lower surface 55 of the leadframe strip 52 is half-etched in a second etch step to form the second recesses 60. The second etch step may include a wet etch, a dry etch, or a combination thereof, using standard semiconductor processing techniques. The second recesses 60 extend more than halfway through the thickness of the leadframe strip 52, in particular, between 60% or 70% of the thickness, and more particularly, 60% of the thickness. It is to be appreciated that collectively the first and second etch steps etch through at least an entire thickness of the leadframe strip, such that through openings are formed between the first recesses and the second recesses.

The patterned layer 59 may be a similar material as patterned layer 56, and removed after forming the recesses 60. Alternatively, patterned layer 59 may be a patterned conductive layer that is not removed after the recesses 60 are formed. In particular, the patterned conductive layer is deposited, such as by plating techniques, on lower surface 55 of the leadframe strip 52. The patterned conductive layer may include one or more conductive materials that are different materials from the leadframe strip itself. For instance, the patterned conductive layer may be one or more metal materials, such as Ni/Pd/Ag, Ni/Pd/Au—Ag alloy, or N i/Pd/Au/Ag.

Figure 3E:
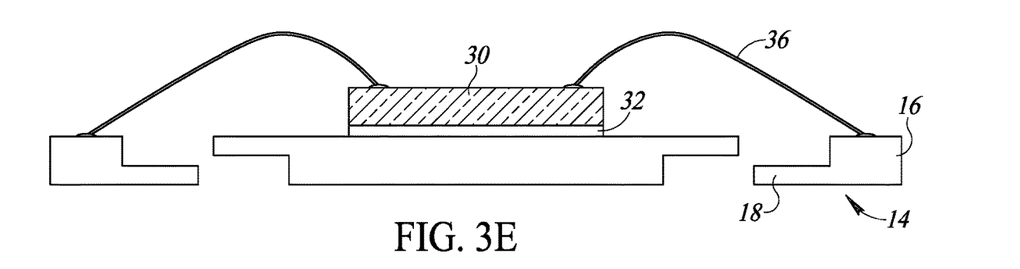

As shown in FIG. 3E, a semiconductor die 30 is coupled to a surface of the die pad 12 by an adhesive material 32, such as tape, paste, glue, or the like. The adhesive material 32 may be first coupled to the semiconductor die 30, to the die pad 12, or both the die and the die pad, prior to placing the semiconductor die 30 on the surface of the die pad 12.

The semiconductor die 30 is electrically coupled to a respective set of leads 14. For instance, a first end 38 of a conductive wire 36 is coupled to a bond pad 40 of the semiconductor die 30, and a second end 42 of the conductive wire 36 is coupled to a surface of the lead 18, as is well known in the art. Although only one die is shown being coupled to one die pad, a plurality of semiconductor dice may be coupled to a plurality of die pads, respectively, of the leadframe strip.

Figure 3F:
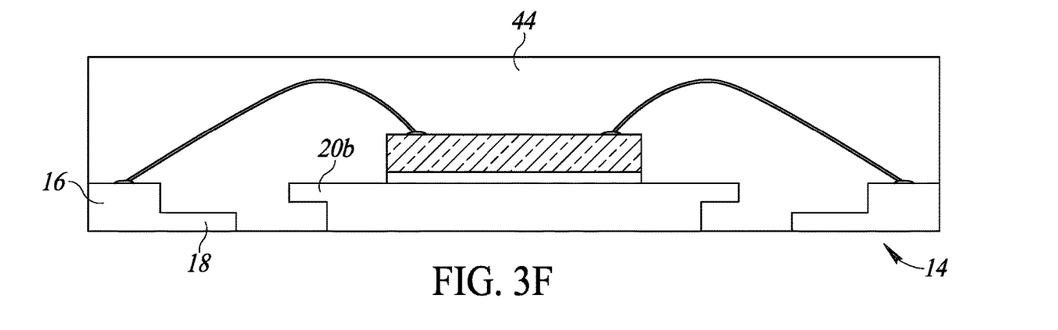

As shown in FIG. 3F, encapsulation material is formed over the leadframe strip 52 so that the encapsulation material surrounds the semiconductor die 30, the conductive wires 36, and portions of the die pad 12 and the leads 14. The encapsulation material may be formed by conventional techniques, for example by a molding process, and in some embodiments is hardened, which may involve a curing step. During molding, the encapsulation material flows within the mold to fill the space between the leads and the die pad (the first and second recesses 58 and 60) such that the base portions of the leads, the die pad, and the encapsulation material form a coplanar surface at a bottom surface of the package. As previously mentioned, the lead locks 16*a* secure the leads in the encapsulation material. Similarly the perimeter portion 20*a*, which includes the protrusions 20*b*, secure the die pad 12 in the encapsulation material. Surfaces of the base portions 18 of the leads are exposed from the encapsulation material at the bottom surface of the package.

The manufacturing process further includes separating each package into individual packages by dicing at dicing streets, as is well known in the art. The packages may be separated using any suitable dicing technique, such as by saw, laser etc. For instance, the packages may be separated using a saw blade that cuts through the encapsulation material and the leads.

It is to be appreciated that the method of making of the package may occur in another order than is shown and described. For example, the second recesses at the lower surfaces may be formed prior to forming the first recesses at the upper surface. Alternatively, the semiconductor dice may be attached to the upper surface prior to etching the lower surface of the leadframe strip.

In one embodiment, the upper portion of the die pad includes protrusions that extend from a single side or two sides, such as two opposing sides. Similarly, the lead locks may extend from a single side of the upper portions of the leads, rather than opposing sides.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming a plurality of first recesses at a first surface of a leadframe; and
   forming a plurality of second recesses at a second surface of the leadframe, the second surface being opposite the first surface, the plurality of second recesses overlapping portions of the plurality of first recesses, wherein forming the plurality of second recesses forms a plurality of leads and a die pad of the leadframe, wherein the plurality of leads include base portions and upper portions, the upper portions extending beyond the base portions in a direction that extends between adjacent leads of the plurality of leads, the base portions of the plurality of leads extending beyond the upper portions toward the die pad, the die pad including a plurality of protrusions that are spaced apart from each other by a plurality of third recesses of the die pad, respectively, the base portions of the plurality of leads facing the plurality of third recesses.

2. The method of claim 1, comprising coupling a semiconductor die to an inner surface of the die pad.

3. The method of claim 2, comprising electrically coupling the semiconductor die to the plurality of leads using conductive elements.

4. The method of claim 3, comprising encapsulating the conductive elements and the semiconductor die and portions of the plurality of leads and die pad in an encapsulation material, wherein the upper portions of the plurality of leads that extend beyond the base portions form lead locks that anchor the plurality of leads in the encapsulation material.

5. The method of claim 4, wherein the protrusions at the inner surface of a perimeter of the die pad anchors the die pad in the encapsulation material.

6. The method of claim 2, wherein forming the plurality of first recesses comprises etching the first surface of the leadframe to form the plurality of first recesses.

7. The method of claim 1, wherein each recess of the plurality of third recesses is between adjacent protrusions of the plurality of protrusions.

8. The method of claim 1, wherein the plurality of first recesses extends more than halfway through a thickness of the leadframe from the first surface.

9. A method, comprising:
coupling a semiconductor die to an inner portion of die pad, the die pad having an outer portion and a plurality of recesses, the outer portion opposite the inner portion, wherein the inner portion has a perimeter that includes a plurality of protrusions spaced apart from each other, each recess of the plurality of recesses is between adjacent protrusions of the plurality of protrusions;
electrically coupling the semiconductor die to a plurality of leads, the plurality of leads being arranged around the perimeter of the die pad, each lead of the plurality of leads including an upper portion and a base portion, the upper portion of each lead extending beyond the base portion in a direction that extends between adjacent leads of the plurality of leads, the base portion of each lead extending towards the die pad and beyond the upper portion, each base portion faces a respective recess of the plurality of recesses; and
encapsulating the semiconductor die in encapsulation material.

10. The method of claim 9, wherein the upper portion of each lead has a first width, wherein the base portion of each lead has a second width, wherein the first width is greater than the second width.

11. The method of claim 9, wherein the upper portion of each lead acts as an anchor embedding the respective lead of the plurality of leads in the encapsulation material.

12. The method of claim 9, wherein a minimum distance between each lead and the die pad is at least 0.15 mm.

13. The method of claim 9, wherein electrically coupling the semiconductor die to the plurality of leads includes using conductive wires to electrically couple the semiconductor die to the plurality of leads.

14. A method, comprising:
coupling a semiconductor die to a die pad, the die pad having an inner portion and an outer portion, the inner portion being larger than the outer portion, wherein the inner portion includes a plurality of protrusions along a first side of the die pad, wherein the plurality of protrusions form recesses between adjacent protrusions;
electrically coupling the semiconductor die to a plurality of leads, the plurality of leads facing the first side of the die pad, the plurality of leads including upper portions and base portions, wherein the base portions of the plurality of leads are staggered relative to the plurality of protrusions of the inner portion of the die pad, wherein the upper portions form lead locks extending in a direction of adjacent leads; and
encapsulating the semiconductor die with encapsulation material,
wherein the upper portions of the plurality of leads extend beyond the base portions of the plurality of leads on opposing sides of the upper portions; and
wherein the base portions of the plurality of leads face the outer portion of the die pad and are aligned relative to the recesses between adjacent protrusions.

15. The method of claim 14, wherein a surface of the outer portion of the die pad and surfaces of the base portions of the plurality of leads are exposed at an outer surface of a semiconductor package.

16. The method of claim 14, wherein the upper portions and the base portions of the plurality of leads are flush with each other at an outer side surface.

17. The method of claim 16, wherein the outer side surface of the plurality of leads are coplanar with the encapsulation material.

18. The method of claim 14, wherein a minimum distance between each lead and the die pad is at least 0.15 mm.

* * * * *